US006919233B2

(12) United States Patent
Papa Rao et al.

(10) Patent No.: US 6,919,233 B2
(45) Date of Patent: Jul. 19, 2005

(54) MIM CAPACITORS AND METHODS FOR FABRICATING SAME

(75) Inventors: Satyavolu S. Papa Rao, Garland, TX (US); Asad M. Haider, Dallas, TX (US); Kelly Taylor, Allen, TX (US); Ed Burke, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 109 days.

(21) Appl. No.: 10/335,333

(22) Filed: Dec. 31, 2002

(65) Prior Publication Data

US 2004/0126981 A1 Jul. 1, 2004

(51) Int. Cl.$^7$ ............................................. H01L 21/62
(52) U.S. Cl. ..................... 438/128; 438/240; 438/396
(58) Field of Search .............................. 438/FOR 220, 438/396, 240, 128, 129

(56) References Cited

U.S. PATENT DOCUMENTS

| | | | | |
|---|---|---|---|---|
| 4,427,457 A | * | 1/1984 | Carlson et al. | 438/395 |
| 4,918,454 A | * | 4/1990 | Early et al. | 341/172 |
| 5,304,506 A | * | 4/1994 | Porter et al. | 438/394 |
| 6,124,163 A | * | 9/2000 | Shirley et al. | 438/238 |
| 6,207,561 B1 | | 3/2001 | Hwang et al. | |
| 6,242,300 B1 | * | 6/2001 | Wang | 438/241 |
| 6,271,084 B1 | | 8/2001 | Tu et al. | |
| 6,300,682 B2 | | 10/2001 | Chen | |
| 6,340,832 B2 | | 1/2002 | Kasahara | |
| 6,387,750 B1 | | 5/2002 | Lai et al. | |
| 6,387,775 B1 | | 5/2002 | Jang et al. | |
| 6,391,707 B1 | | 5/2002 | Dirnecker et al. | |
| 6,430,028 B1 | | 8/2002 | Kar-Roy et al. | |
| 6,436,787 B1 | | 8/2002 | Shih et al. | |
| 2003/0169560 A1 | * | 9/2003 | Welsch et al. | 361/524 |
| 2004/0209423 A1 | * | 10/2004 | Tian | |

OTHER PUBLICATIONS

"High Density Metal Insulator Metal Capacitors Using PECVO Nitride for Mixed Signal and RF Circuits", Arjun Kar–Roy, Chun Hu, Marco Racanelli, Cory A Compton, Paul Kempf, Gurvinder Jolly, Phil N. Sherman, Jie Zheng, Zhe Zhang and Aiguo Yin; Jun. 1999 IEEE, pp. 245 to 247.
"A 0.13$\mu$m CMOS Platform with Cu/Low–k Interconnects for System On Chip Applications", T. Schiml, S. Biesemans, G. Brase, L. Burrell, A. Cowley, K.C. Chen, A. v. Ehrenwall, B. v. Ehrenwall, P. Felsner, J. Gill, F. Grellner, F. Guarin, L.K. Han, M. Hoinkis, E. Hsiung, E. Kaltalioglu, P. Kim, G. Knoblinger, S. Kulkarni, A Leslie, T. Mono, T. Schafbauer, U. Schroeder, K. Schruefer, T. Spooner, D. Warner, C. Wang R. Wong E. Demm, P. Leung, M. Stetter, C. Wann, J.K. and Chen, E. Crabbe: 2001 Symposium on VLSI Technology Digest of Technical Papers, pp. 101–102.
"Integration of Thin Film MIM Capacitors and Resistors into Copper Metallization based RF–CMOS and BI–CMOS Technologies", Peter Zurcher, Prasad Alluri, Peir Chu, Alain Duvallet, Chris Happ, Rashaunda Henderson, John Mendonca, Matthew Kim, Michael Petras, Mark Raymond, Tom Remmel, Doug Roberts, Bob Steimle, Jim Stipanuk, Sherry Straub, Terry Sparks, Marc Tarabbia, Helene Thibieroz and Mel Miller; Apr. 2000, pp. 153 to 156.

* cited by examiner

Primary Examiner—George Fourson
(74) Attorney, Agent, or Firm—Rose Alyssa Keagy; W. James Brady, III; Frederick J. Telecky, Jr.

(57) ABSTRACT

Semiconductor devices and methods for making the same are described in which a single high k or ferroelectric dielectric layer is used to form decoupling capacitors and analog capacitor segments. Analog capacitors are formed by coupling analog capacitor segments in series with one another, wherein the capacitor segments may be connected in reverse polarity relationship to provide symmetrical performance characteristics for the analog capacitors.

31 Claims, 16 Drawing Sheets

MIM CAPACITORS AND METHODS FOR FABRICATING SAME

FIELD OF INVENTION

The present invention relates generally to semiconductor devices and more particularly to analog and digital MIM capacitors and methods for fabricating such in the manufacture of semiconductor device products.

BACKGROUND OF THE INVENTION

Capacitors are employed in digital and analog devices for a variety of purposes, including storing electrical charge, filtering, blocking DC voltage levels, and stabilizing power supplies (e.g., decoupling switching noise from DC supplies). Typical capacitors used in semiconductor devices may have the structure of a metal oxide semiconductor (MOS) type, a P-N junction type, a polysilicon-insulator-polysilicon (PIP) type, a metal-insulator-metal (MIM) type, etc., wherein the type of capacitor employed typically depends on the application (e.g., analog or digital) and desired response characteristics of the device.

PIP capacitors suffer from capacitance variations caused by the doping characteristics of the polysilicon capacitor electrode plates, and as such, these devices exhibit fairly large changes in the capacitance as a function of applied voltage. Hence these devices have a large voltage coefficient of capacitance (VCC), typically measured in parts per million per volt (ppm/V). In addition, parasitic effects are seen in MOS type transistors where the capacitor is located proximate the substrate. MIM type capacitors may be advantageously fabricated in upper interconnect layers of a semiconductor device wafer to mitigate such parasitic effects. MIM capacitors are further desirable, since the electrode plates are fabricated from conductive metal materials, whereby the polysilicon doping issues and polysilicon depletion associated with PIP capacitors are avoided.

Voltage dependent capacitance effects are generally more detrimental in analog capacitors than in decoupling capacitors. Thus, in semiconductor devices having both analog and digital circuitry (e.g., sometimes referred to as mixed-signal devices), some capacitors have different design performance criteria than others. In this regard, mixed-signal devices generally employ decoupling capacitance to reduce power supply transients associated with switching transistors, as well as analog capacitors for filtering and other types of analog circuits.

Decoupling capacitors (e.g., digital capacitors) require high capacitance density (e.g., measured in fF/um$^2$) in order to minimize the amount of device area devoted to decoupling. In some cases, capacitance densities of 10 fF/um$^2$ or more are desired to minimize the die area occupied by decoupling capacitors, particularly as higher clock speeds (e.g., transistor switching speeds) dictate increased decoupling capacitance requirements. However, decoupling capacitors generally are not as sensitive to the dependence of capacitance on voltage as are analog capacitors. For instance, a decoupling capacitor connected between a power supply rail and ground will not see large fluctuations in applied voltage during normal operations (e.g., apart from fast transient switching noise in digital circuits). Thus, for a decoupling capacitor designed to decouple high frequency noise from a 3 V DC supply, the difference in capacitance at 1 V is relatively unimportant.

Conversely, analog circuits do not demand such high capacitance densities, wherein densities of around 3 fF/um$^2$ or less may be used. However, analog circuits are much less tolerant of capacitance variations during operation than are digital circuits. For example, if the impedance of the capacitor is not reasonably predictable or consistent across the range of expected applied voltages, the circuit performance could be different for different applied voltages, and consequently, the performance of the analog circuit may be unsatisfactory. Thus, whereas decoupling capacitors can be successfully employed with relatively large fluctuations in capacitance with changes in applied voltage, analog capacitors are typically designed to have VCC specifications in a range of about 300 ppm/V or less.

These divergent capacitor design goals often lead to separate processing operations to form digital (e.g., decoupling) and analog capacitors in the manufacture of semiconductor devices, particularly in mixed-signal type devices. Separate capacitor dielectrics have conventionally been employed since the VCC coefficients typically get smaller as dielectric film thickness is increased, while the capacitance density is reduced for thicker dielectrics. Some processes fabricate analog and decoupling MIM type capacitors in separate interconnect levels or layers, while others form different dielectric layers in the same interconnect level for the analog and digital MIM capacitors. In either case, multiple masks and process steps are required to separately form the decoupling and analog capacitors. It is a continuing goal to reduce or streamline the number of such processing steps, so as to increase product throughput and reduce product cost in the manufacture of semiconductor devices. Accordingly, there is a need for capacitor structures and processing methods by which analog and decoupling capacitors can be fabricated to accommodate the different performance requirements with respect to VCC, leakage current, and capacitance density, and which reduce the number of processing steps required for capacitor fabrication.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to semiconductor devices and methods for making the same in which a single dielectric layer is used to form metal-insulator-metal (MIM) decoupling capacitors and analog capacitor segments. Analog capacitors are formed by coupling analog capacitor segments in series with one another. High k dielectric material or ferroelectric material may be used to form the single dielectric layer for the analog and decoupling capacitors, and the polarities of the analog capacitor segments may be reversed to effectively reduce asymmetric effects related to applied voltage. In this manner, a streamlined manufacturing process may be achieved, which produces capacitors adapted for the different requirements of analog and decoupling (e.g., digital) capacitors.

In accordance with one aspect of the invention, a method of fabricating capacitors in a mixed-signal semiconductor device is provided, which comprises forming a dielectric layer above a wafer, forming a decoupling capacitor and a plurality of analog capacitor segments using the dielectric layer, and coupling two or more of the analog capacitor segments in series to form an analog capacitor. The dielectric layer may be a high k dielectric material, such as having a dielectric constant k greater than about 8, for example, tantalum oxide (TaO), or ferroelectric material, for example, Pb(Zr,Ti)O3 (PZT), (Ba,Sr)TiO3 (BST), SrTiO3 (STO) and SrBi2Ta2O9 (SBT), BaTiO3 (BTO), (Bil-xLax) 4Ti3O12 (BLT), or other ferroelectric material, deposited over a conductive (e.g., metal) bottom electrode layer. A top electrode layer is then formed over the dielectric, wherein the top and bottom electrode layers may comprise any suitable material, such as titanium nitride (TiN), titanium aluminum nitride (TiAlN), iridium (Ir), iridium oxide (IrO), or others.

The top and bottom electrode layers and the dielectric layer are then patterned using a single mask, so as to form decoupling capacitors and analog capacitor segments in a small number of processing steps in the manufacturing flow. The patterning provides one or more decoupling capacitors, as well as a number of analog capacitor segments separated from one another, individually comprising unetched portions of the bottom electrode layer, the dielectric layer, and the top electrode layer, wherein the dielectric material in the decoupling capacitor and the plurality of analog capacitor segments are of substantially the same thickness.

The analog capacitor segments are series coupled to form analog capacitors having the desired lower effective capacitance density ($fF/um^2$), wherein the individual segments may be interconnected in reverse polarity relationship to provide substantially symmetric capacitance vs. voltage and leakage current performance characteristics. For example, the analog capacitor segments may be connected in series by electrically connecting bottom electrode portions of first and second analog capacitor segments to one another or by electrically connecting top electrode portions of first and second analog capacitor segments to one another.

Any number of such segments may be connected in this manner to form analog capacitors of a desired capacitance value. In one example, four such segments are coupled through electrically connecting bottom electrode portions of first and second analog capacitor segments to one another, electrically connecting top electrode portions of second and third analog capacitor segments to one another, and electrically connecting bottom electrode portions of third and fourth analog capacitor segments to one another to form an analog capacitor. In this manner, the design parameters for both decoupling (e.g., digital) capacitors and analog capacitors may be met, while reducing the total number of processing steps (e.g., and hence the cost) in manufacturing mixed-signal and other types of semiconductor devices.

In another aspect of the invention, a semiconductor device is provided, which comprises an analog capacitor having first and second analog capacitor segments coupled in series, wherein the first and second analog capacitor segments comprise first and second portions of a dielectric layer, respectively, and a decoupling capacitor comprising a third portion of the dielectric layer. The first and second analog capacitor portions may be coupled in reverse polarity relationship to one another, so as to provide a resulting analog capacitor having a substantially symmetrical VCC and leakage current performance with respect to applied voltage, such as by coupling top electrode portions thereof together, or by coupling bottom electrode portions thereof together. The dielectric layer used to form the decoupling capacitor and the analog capacitor segments may comprise a high k dielectric material, such as TaO material or ferroelectric materials, wherein the top and bottom electrodes may be fashioned from TiN, TiAlN, Ir, IrO, or other metal materials.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
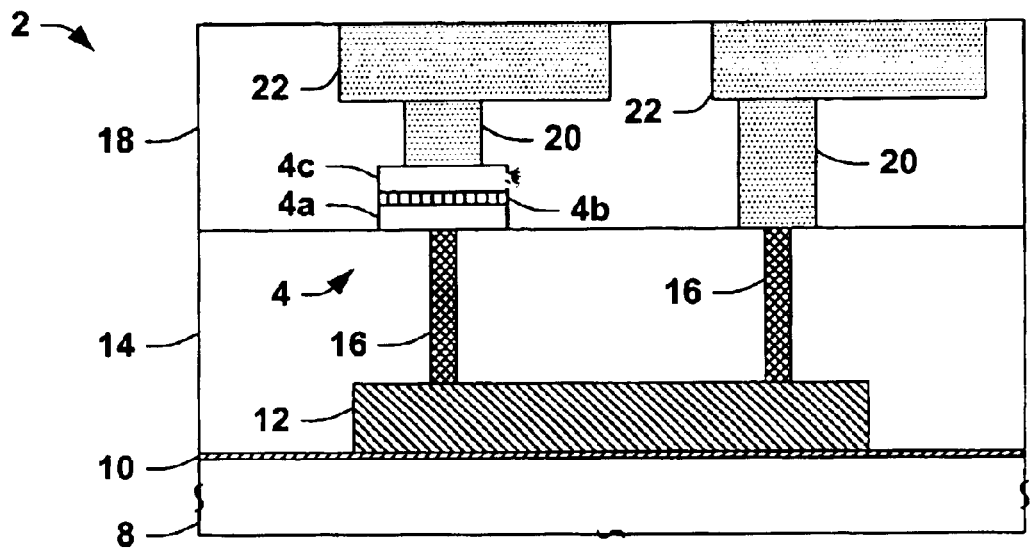
FIG. 1A is a partial side elevation view in section illustrating a MIM analog capacitor fabricated in a first interconnection layer (e.g., ILD1)

The present invention will now be described with reference to the attached drawings, wherein like reference numerals are used to refer to like elements throughout. The invention relates to semiconductor devices and methods for making the same, in which a single dielectric layer (e.g., comprising high k dielectric or ferroelectric material) is used to form MIM decoupling capacitors and analog capacitor segments. Analog capacitors are then formed by coupling two or more of the analog capacitor segments in series with one another, wherein polarity reversal may be employed in the segmented analog capacitors to mitigate asymmetrical behavior of the individual analog capacitor segments.

Figure 1B:
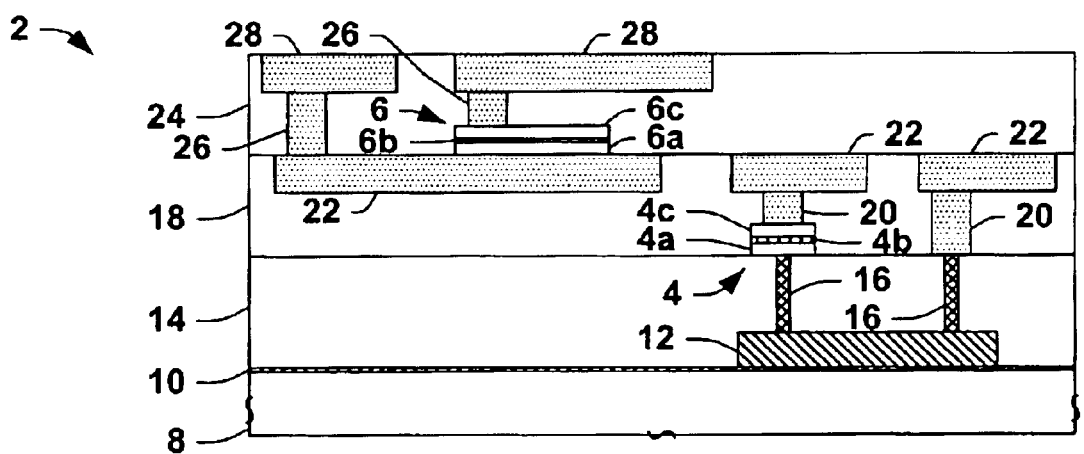
FIG. 1B is a partial side elevation view in section illustrating the device of FIG. 1A with a MIM decoupling capacitor fabricated in a second interconnection layer (e.g., ILD2)

Referring initially to FIGS. 1A and 1B, a semiconductor device 2 is illustrated, wherein a unitary analog MIM capacitor 4 has been fabricated in a first interconnect level or layer (e.g., ILD1) and a decoupling (e.g., digital) capacitor 6 is formed in a second (e.g., ILD2) interconnect layer (FIG. 1B). The device 2 includes a semiconductor substrate 8 with a thin gate dielectric 10 (e.g., gate oxide) formed thereover, where a polysilicon structure 12 is formed over the gate dielectric 10. The gate dielectric 10 and the polysilicon structure 12 may be fabricated contemporaneously with fabrication of patterned transistor gate structures (not shown) elsewhere in the device 2 according to known semiconductor fabrication techniques, wherein the polysilicon structure 12 is rendered conductive, for example, through implantation of dopant impurities.

An initial layer 14 of inter layer dielectric material (e.g., ILD0) is formed over the gate dielectric 10 and the polysilicon 12, and tungsten contacts 16 are formed through the ILD0 layer 14 to contact the polysilicon structure 12. The capacitor 4 is fabricated by deposition and patterning of a metallic bottom electrode material 4a, a dielectric material 4b, and an upper metal electrode material 4c, and a first interconnect level dielectric layer 18 (e.g., ILD1) is formed over the initial ILD0 layer 14. Via openings and trench openings are then formed in the ILD1 layer 18 and filled with a first metal material (e.g., M1) to form first layer vias 20 and wiring (e.g., interconnect routing) structures 22.

As illustrated in FIG. 1B, a larger MIM decoupling capacitor 6 is formed over the ILD1 interconnect level 18, comprising patterned bottom electrode material 6a, a dielectric material 6b, and an upper metal electrode material 6c, wherein the decoupling dielectric material 6b is much thinner than the analog capacitor dielectric 4b. A second inter layer dielectric material layer 24 (e.g., ILD2) is deposited over the capacitor 6, the wiring structures 22 and the ILD1 layer 18. Openings for vias and trenches are formed in the ILD2 layer 24 and filled with a second metal material (e.g., M2) to form second layer vias 26 and wiring structures 28.

As can be seen from FIGS. 1A and 1B, the formation of the analog and decoupling MIM capacitors 4 and 6, respectively, requires separate masks and processing steps for each capacitor. As described above, it is desirable to reduce the number of processing operations in the manufacture of semiconductor products, while achieving the performance requirements with respect to VCC, leakage current, and capacitance density for both analog and decoupling capacitors. The inventors have appreciated that a single dielectric layer may be employed in forming both these types of capacitors in a single interconnect level during back end semiconductor processing. Further, it is noted that in many high speed mixed-signal devices, the amount of decoupling capacitance required is fairly large, wherein decoupling capacitors occupy a much larger percentage of the total die area than do analog capacitors.

Accordingly, one aspect of the present invention advantageously employs a single dielectric layer for formation of both types of capacitors, for example, formed of ferroelectric material or high k material having a dielectric constant k greater than about 8, so as to provide sufficient capacitance density to accommodate the decoupling capacitance requirements without occupying excessive die real estate. In one example illustrated and described hereinafter, tantalum oxide (TaO) is employed in forming the dielectric layer for the device capacitors, although ferroelectric materials such as PZT, BST, STO, SBT, BTO, BLT, or other appropriate ferroelectric or high k dielectric material may be used in accordance with the invention. Further aspects of the invention provide for series coupling multiple analog capacitor segments to form analog capacitors, wherein the effective capacitance density thereof may be tailored according to the number of such segments coupled in forming the analog capacitors. Any number of such segments may be so coupled, wherein the examples below illustrate the use of two or four analog capacitor segments.

The inventors have further appreciated that the use of certain high k dielectric materials results in capacitors with asymmetric performance characteristics relating to leakage current and capacitance (e.g., VCC) as a function of applied voltage. In another aspect of the invention, the series coupled analog capacitor segments may be coupled in reverse polarity relationship to one another, in order to counteract or avoid these asymmetric characteristics. These aspects of the invention may be combined in order to advantageously provide decoupling capacitors which occupy a reasonably small amount of die area while providing adequate capacitance density (e.g., such as about 10 $fF/um^2$, depending on the material and thicknesses selected), and analog capacitors having relatively small effective VCC values (e.g., such as about 300 ppm/V or less in certain examples below) with acceptable capacitance densities (e.g., single digit $fF/um^2$).

Figure 2A:
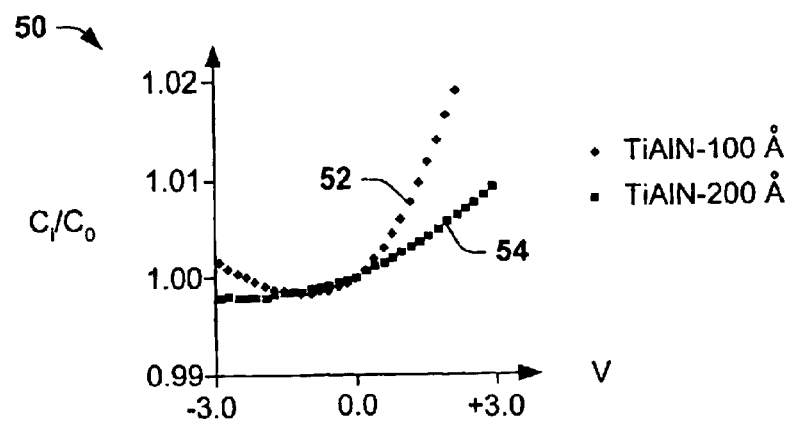
FIG. 2A is a plot illustrating an asymmetric voltage capacitance coefficient (VCC) vs. applied voltage performance characteristic for the MIM capacitor of FIG. 1A.
Figure 2B:
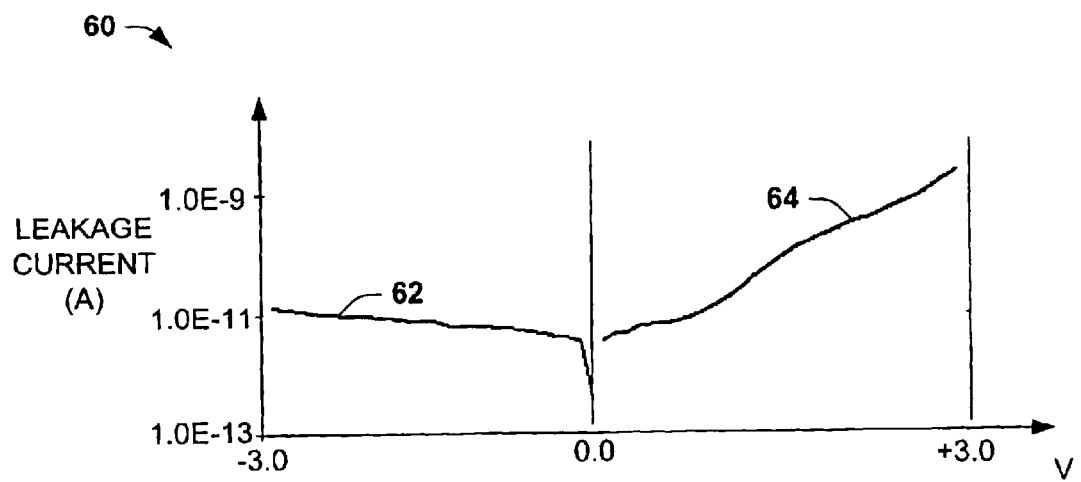
FIG. 2B is a plot illustrating an asymmetric leakage current vs. applied voltage performance characteristic for the MIM capacitor of FIG. 1A.

Referring now to FIGS. 2A and 2B, a plot 50 illustrates an asymmetric voltage capacitance coefficient (VCC) vs. applied voltage performance characteristic for the unitary analog MIM capacitor 4 and FIG. 2B provides a plot 60 illustrating an asymmetric leakage current vs. applied voltage performance characteristic for the capacitor 4 above. In this example, the capacitor dielectric material 4b comprises TaO, wherein the VCC plot 50 illustrates a curve 52 corresponding to a dielectric thickness of about 100 Å and a curve 54 for a dielectric thickness of about 200 Å. As can be seen from the curves 52 and 54, the VCC coefficients are reduced as the dielectric layer thickness increases. In the plot 50, the Y axis represents a ratio of capacitance at a certain applied voltage (e.g., $C_i$) scaled by the capacitance at 0 V (e.g., $C_0$). In this regard, the capacitance $C_i$ can be modeled according to the following second order equation (1):

$$C_i(V)=C_0+A*V+B*V^2, \quad (1)$$

where $C_i(0)=C_0$. This relationship may alternatively be expressed as:

$$C_i(V)/C_0=K+A_1*V+A_2*V^2, \quad (2)$$

where K is theoretically equal to one, and $A_1$, $A_2$ are given in units of parts per million per volt (e.g., ppm/V) and $ppm/V^2$, respectively. In this regard, $A_1$ is given as $A/C_0$ and $A_2$ is $B/C_0$.

As can be seen in the plot 50 of FIG. 2A, each of the curves 52 and 54 are asymmetrical with respect to positive and negative applied voltage, wherein the capacitance value changes more for a positive voltage applied to the top electrode 4c (FIG. 1A), than for a negative applied voltage. It is further noted in FIG. 2A, that the asymmetric VCC characteristic remains even for different dielectric thicknesses. Thus, in the above equation 2, the high k dielectric capacitor 4 has a non-zero first order coefficient $A_1$. In one example, where the dielectric layer 4b is TaO having a thickness of about 160 Å, $A_1$ has been found to be about −1775 ppm/V, and $A_2$ is about 370 $ppm/V^2$.

In FIG. 2B, an exemplary plot 60 illustrates asymmetric leakage current behavior for a capacitor (e.g., capacitor 4 of FIGS. 1A and 1B) having a TaO dielectric 4b of about 160 Å thick. For a negative applied voltage (e.g., the top electrode 4c negative with respect to the bottom electrode 4a), the leakage current curve 62 is generally flat at about 1 E-11 A. Conversely, for a positive applied voltage (e.g., top electrode 4c positive with respect to the bottom electrode 4a), the curve 64 shows leakage current rising as higher voltage is applied. In the above example, where the dielectric layer 4b is TaO having a thickness of about 160 Å, the forward leakage current 64 at 3 V has been found to be about 1 E-8 A, and the reverse leakage 62 is about 6 E-11 A at −3V.

It will be appreciated that the asymmetric VCC and leakage current behavior illustrated in FIGS. 2A and 2B are less desirable in analog capacitor applications, but may be acceptable for decoupling and other digital capacitor applications in a mixed signal device. The inventors have appreciated that the asymmetric characteristics of the capacitor 4 result from the fact that TaO and many high k dielectric materials are oxides. During deposition of the TaO layer 4b over the bottom electrode 4a (e.g., titanium nitride (TiN), titanium-aluminum-nitride (TiAlN), Iridium (Ir), or others), the wafer is in an oxidizing atmosphere, which oxidizes at least a portion of the bottom electrode 4a. However, the top electrode 4c does not encounter such an oxidizing environment. Rather, the top electrode layer 4c (e.g., which may be the same material and thickness as the bottom electrode 4a) is deposited in a very high vacuum.

Thus, in the device 4, the top electrode 4c and the bottom electrode 4a behave differently in the presence of applied voltages. For example, the leakage characteristics are asymmetric for high-k dielectrics to a lesser or greater extent depending on the resistance of the electrode material to oxidation (e.g., FIG. 2B). In this regard, the inventors have appreciated that the bottom electrode 4a tends to leak more than the top electrode 4c if the capacitor 4 is biased such that electrons are coming off from the bottom electrode interface (e.g., positive curve 64), more electron emission results than is the case for the opposite bias at the top electrode 4c (e.g., curve 62).

Figure 3A:
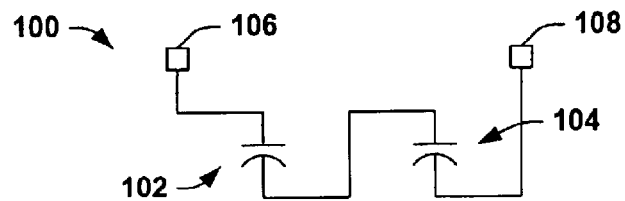
FIG. 3A is a schematic diagram illustrating two analog capacitor segments coupled in series with no polarity reversal to form an analog capacitor in accordance with an aspect of the present invention.
Figure 3B:
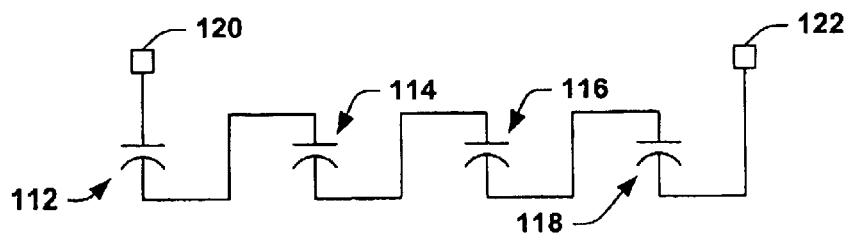
FIG. 3B is a schematic diagram illustrating four analog capacitor segments coupled in series with no polarity reversal to form an analog capacitor in accordance with the invention.

Referring now to FIGS. 3A and 3B, one aspect of the invention provides for forming analog capacitors by series coupling two or more analog capacitor segments, in order to reduce both the voltage coefficients $A_1$ and $A_2$. FIG. 3A illustrates one such implementation of an analog capacitor 100 comprising two capacitor segments 102 and 104 coupled in series between terminals 106 and 108, with no polarity reversal. The inventors have found that series coupling the capacitor segments 102 and 104 provides a reduction in the VCC coefficients $A_1$ and $A_2$, thereby improving the capacitor performance in analog applications. In one example where a 160 Å thick TaO dielectric is used, a capacitance density of about 3 $fF/um^2$ is achieved, wherein $A_1$ is about −887 ppm/V and $A_2$ is about 185 $ppm/V^2$. It will be appreciated that other materials may be used in forming the dielectric, such as other high k dielectrics and ferroelectric materials, without departing from the scope of the present invention.

FIG. 3B illustrates another exemplary implementation of this aspect, wherein an analog capacitor 110 comprises four such capacitor segments 112, 114, 116, and 118 coupled in series between terminals 120 and 122, again with no polarity reversal. Where the segments 112–118 employ a TaO dielectric of about 160 Å thickness, a capacitance density of about 0.75 fF/um² is achieved, with $A_1$ being about −443 ppm/V and $A_2$ being about 23 ppm/V². It is noted that the capacitance density is further reduced for the capacitor 110 since there are effectively four TaO dielectric layers of about 160 Å in series.

For N such series coupled capacitor segments with no polarity reversal, the above VCC equation may be rewritten in terms of a voltage capacitance coefficient $C_t$ for the composite capacitors 100, 110 as:

$$C_t(V) = C_i(V/N)/N, \quad (3)$$
$$= C_0/N + A^*V/N^2 + B^*V^2/N^3$$
$$= C_t(0) + A^*V/N^2 + B^*V^2/N^3,$$

where $C_t(0) = C_0/N$. As with the above equation (2), equation (3) may be alternatively scaled by $C_t(0)$ and expressed as:

$$C_t(V)/C_t(0) = 1 + A_1^*V + A_2^*V^2, \quad (4)$$

where $A_1 = A/NC_0$ and $A_2$ is $B/N^2C_0$. Thus, compared with a unitary capacitor, the segmentation of the analog capacitors 100, 110 into N segments coupled in series provides a reduction in $A_1$ by a factor of N, and a reduction in the second order coefficient $A_2$ by a factor of $N^2$. Thus, for the segmented capacitor 110 of FIG. 3B, the first order coefficient $A_1$ is about −443 ppm/V and the second order coefficient $A_2$ is about 23 ppm/V². It is noted at this point that the segmentation of analog capacitors in accordance with this aspect may be advantageously employed to mitigate the asymmetrical VCC performance characteristics of the high k dielectric materials, while allowing the space saving benefits of the high dielectric constant (e.g., higher capacitance density) to benefit the decoupling capacitors in a semiconductor product, while providing acceptable capacitance density for both applications.

Figure 4A:
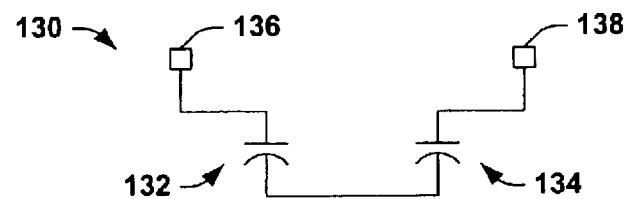
FIG. 4A is a schematic diagram illustrating two analog capacitor segments coupled in series with polarity reversal to form an analog capacitor in accordance with another aspect of the present invention.
Figure 4B:
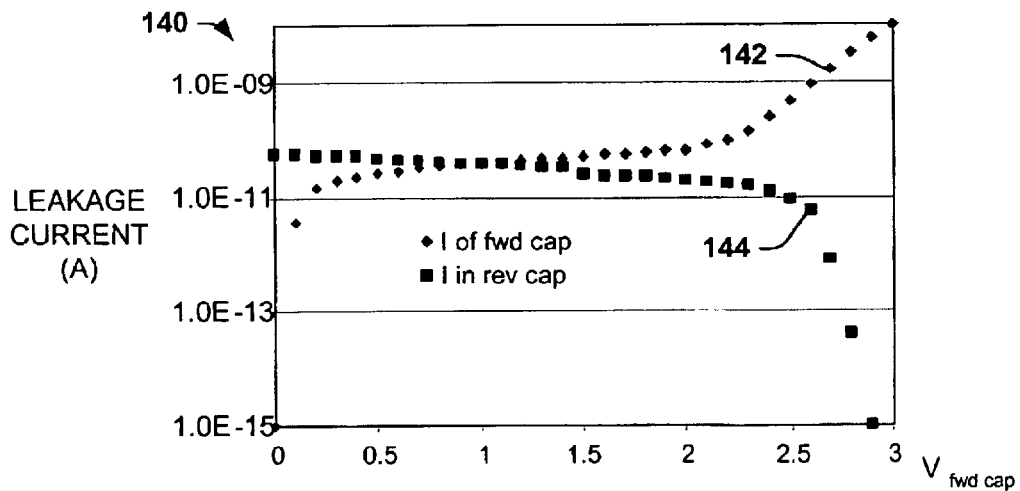
FIG. 4B is a plot illustrating two leakage current curves for individual capacitor segments showing an expected leakage current vs. voltage of a forward capacitor performance characteristic for the segmented analog capacitor of FIG. 4A.
Figure 4C:
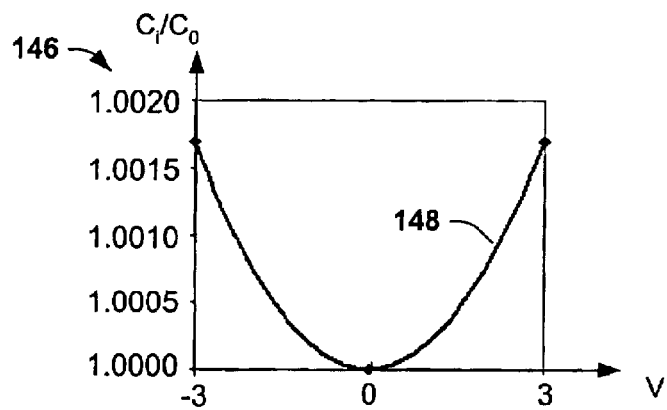
FIG. 4C is a plot illustrating a substantially symmetric VCC vs. applied voltage performance characteristic for the segmented capacitor of FIG. 4A.

Referring now to FIGS. 4A–4C, another aspect of the invention provides for reversing the polarity of the series coupled analog capacitor segments, by which the asymmetrical leakage current performance of the high k dielectric capacitors may be eliminated (e.g., $A_1$ theoretically goes to zero). FIG. 4A illustrates one example of such a composite analog capacitor 130 comprising two analog capacitor segments 132 and 134 coupled in series between terminals 136 and 138, wherein the polarities of the segments 132 and 134 are reversed with respect to one another. Where the individual segments 132 and 134 comprise a TaO dielectric layer having a thickness of about 160 Å, and where the top and bottom electrodes comprise TiN or TiAlN, the VCC coefficient $A_1$ is essentially zero and $A_2$ is about 188 ppm/V², with a capacitance density for the composite capacitor 130 being about 3 fF/um².

In the illustration of FIG. 4A, the bottom electrodes of the segments 132 and 134 are coupled together, although other implementations are possible within the scope of the invention, wherein the top electrodes are coupled together. In the device 130, where the terminal 136 is biased more positive than the terminal 138, the segment 132 is forward biased, while the other segment 134 is reverse biased. In this regard, the schematic capacitor symbols employed herein designate the straight cross-bar as the top electrode of a capacitor segment, and the curved cross-bar as the lower or bottom electrode. Thus, as described above, the curved cross-bar (lower or bottom electrode) tends to leak more than does the straight cross-bar (top electrode), because the bottom electrode tends to become partially oxidized during formation of the dielectric layer.

FIG. 4B provides a plot 140 illustrating an expected leakage current vs. forward capacitor voltage performance characteristic for the segmented analog capacitor 130 of FIG. 4A, wherein a curve 142 illustrates the leakage of the forward biased segment and curve 144 illustrates the leakage current of the reverse biased segment. The reversed coupling of the segments 132 and 134 provides for the leakage current of the composite capacitor 130 to follow the lower of the two curves 142, 144. Thus, the polarity reversal aspect of the invention provides for symmetrical leakage current performance of the segmented capacitor 130, while the segmentation aspect provides for reducing the asymmetry in the VCC performance (e.g., by reducing the first order coefficient $A_1$), and also reduces $A_2$. FIG. 4C provides a plot 146 of VCC vs. applied voltage for the analog capacitor 130, showing a generally symmetrical curve 148, wherein the first order VCC coefficient $A_1$ is substantially zero.

Figure 5A:
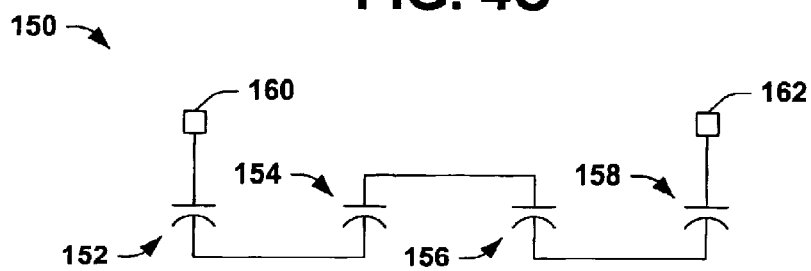
FIG. 5A is a schematic diagram illustrating four analog capacitor segments coupled in series with polarity reversal to form an analog capacitor in accordance with the invention.
Figure 5B:
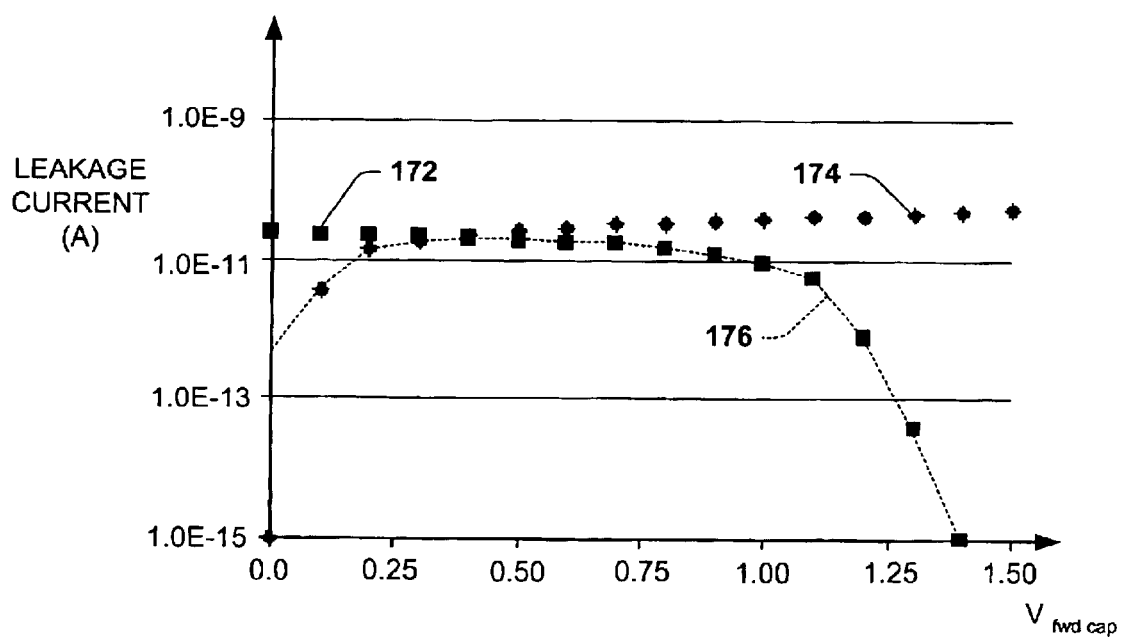
FIG. 5B is a plot illustrating a leakage current vs. forward capacitor voltage performance characteristic for the segmented analog capacitor of FIG. 5A.
Figure 5C:
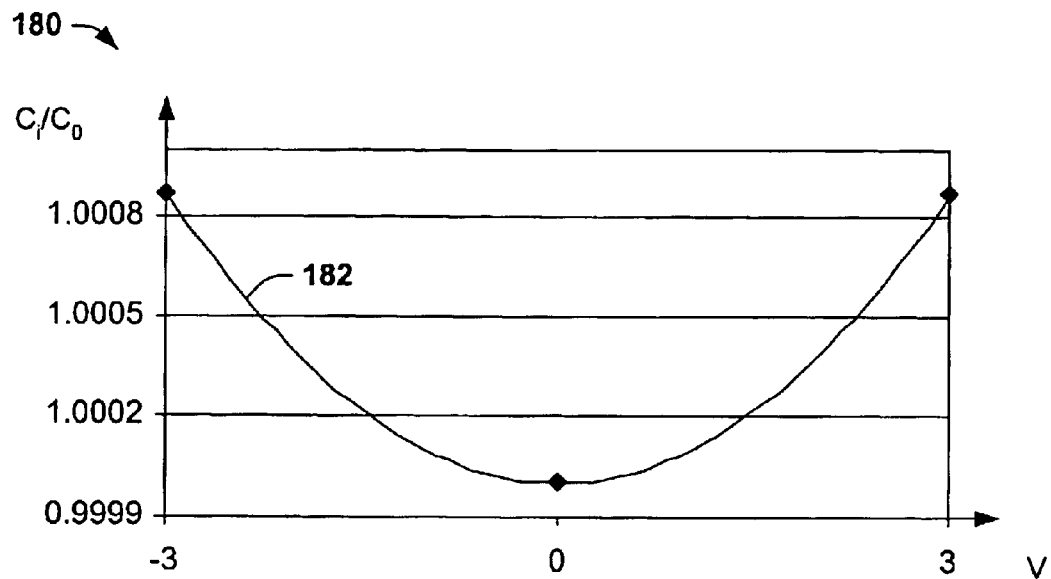
FIG. 5C is a plot illustrating a substantially symmetric VCC vs. applied voltage performance characteristic for the segmented MIM capacitor of FIG. 5A.
Figure 5D:
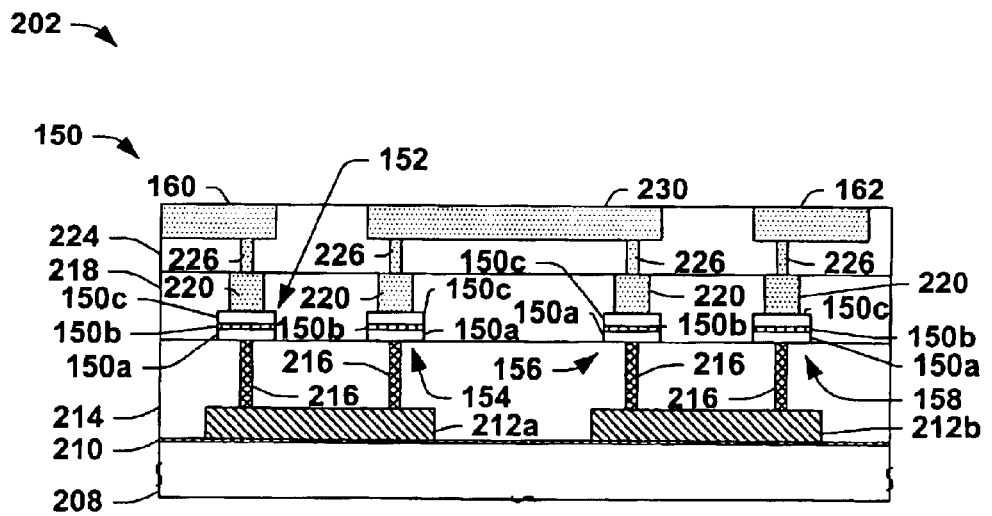
FIG. 5D is a partial side elevation view in section illustrating one implementation of a four segment analog capacitor in accordance with another aspect of the invention.

Another exemplary implementation of these aspects of the invention is presented in FIGS. 5A–5D, wherein FIG. 5A schematically illustrates a segmented analog capacitor 150 comprising four capacitor segments 152, 154, 156, and 158 coupled in series between terminals 160 and 162. One exemplary structure of the composite capacitor 150 is illustrated in FIG. 5D, described below. As shown in FIG. 5A, the bottom electrodes of the segments 152 and 154 are coupled together, as are the bottom electrodes of the segments 156 and 158, with the top electrodes of the segments 154 and 156 also coupled together. Other implementations are possible within the scope of the invention, wherein at least one segment in a series of N segments is reversed with respect to one or more of the others, by which the leakage current characteristic may be modified, and wherein the number of such segments N may be an odd or even integer greater than 1.

FIG. 5B provides a leakage current plot 170 corresponding to the segmented capacitor 150, wherein the individual analog capacitor segments comprise a TaO dielectric layer having a thickness of about 160 Å, and where the top and bottom electrodes comprise TiN or TiAlN. The data points 172 correspond to leakage through a reversed biased segment, and the data 174 represents the leakage of a forward biased segment. As with the above capacitor 130, the leakage current for the segmented capacitor 150 follows a curve 176 along the lower of the two curves 172 and 174 in FIG. 5B. The composite segmented capacitor 150 achieves a capacitance density of about 0.75 fF/um² in this example. FIG. 5C provides a plot 180 illustrating a generally symmetric VCC vs. applied voltage performance characteristic curve 182 for the segmented MIM capacitor 150 of FIG. 5A, having a substantially parabolic shape. As can be seen from the symmetry of the curve 182, the first order VCC coefficient $A_1$ is essentially zero for the capacitor 150, with the second order coefficient A2 being about 97 ppm/V².

Figure 5E:
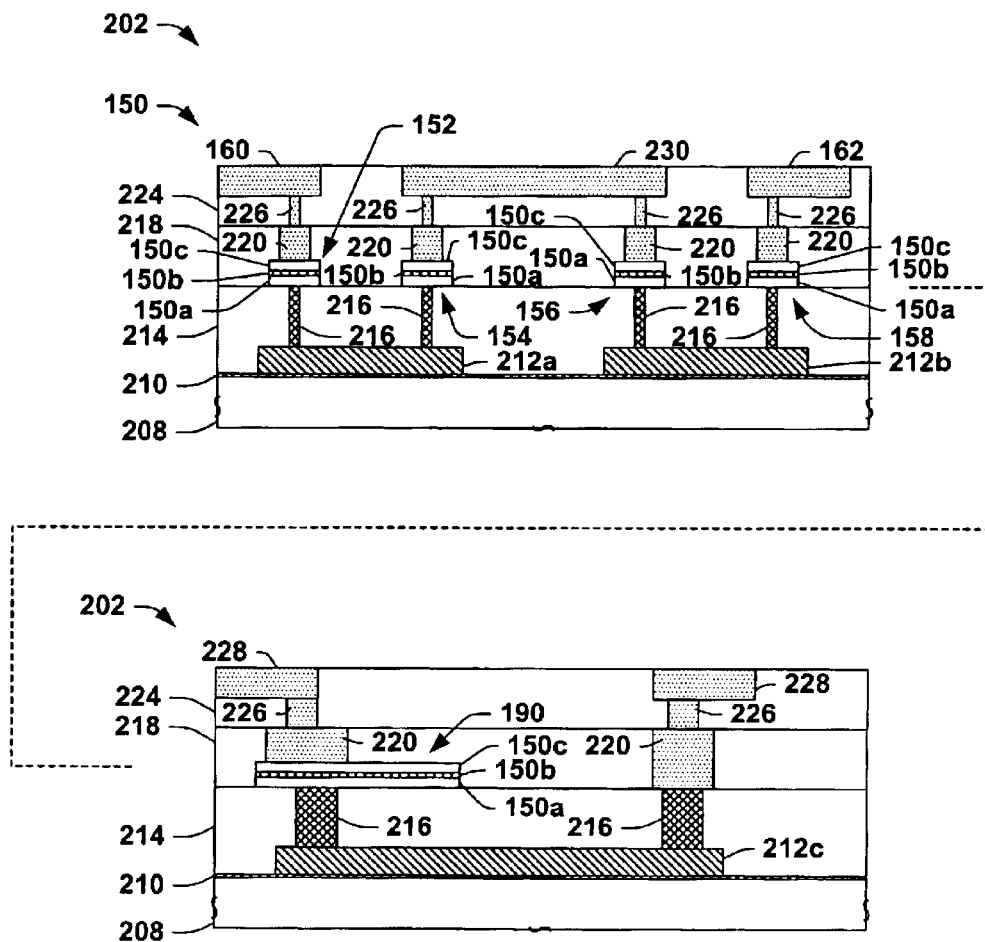
FIG. 5E is a partial side elevation view in section illustrating the device of FIG. 5A, comprising a four segment analog capacitor and a decoupling capacitor formed using a single high k dielectric layer and a single mask in accordance with the invention.

FIG. 5D provides a partial side elevation view in section illustrating one exemplary structural implementation of a semiconductor device 202 comprising the four segment analog capacitor 150 and FIG. 5E illustrates the fabrication of a unitary digital (e.g., decoupling) capacitor 190 in the device 202 using the same processing steps, mask, and dielectric layer as the segmented analog capacitor 150. The segmented analog MIM capacitor 150 has been fabricated in a first interconnect level or layer along with the decoupling (e.g., digital) capacitor 190 in accordance with an aspect of the invention. The device 202 comprises a semiconductor substrate 208 with a thin gate dielectric 210 (e.g., gate oxide) formed over the substrate 208. Alternatively, the invention may be employed in SOI type devices, wherein the silicon 208 is an epitaxial layer formed over an insulator layer (not shown).

Polysilicon structures 212 are formed over the gate dielectric 210, wherein the gate dielectric 210 and the polysilicon structures 212 may be fabricated contemporaneously with fabrication of patterned transistor gate structures (not shown) elsewhere in the device 202 according to known semiconductor fabrication techniques. In this regard, the polysilicon structures 212 are rendered conductive, for example, through implantation of dopant impurities and perhaps silicidation, wherein structures 212a and 212b are employed to interconnect the analog capacitor segments 152, 154, 156, and 158, and the structure 212c is used to provide connection for the decoupling capacitor 190.

Figure 13A:
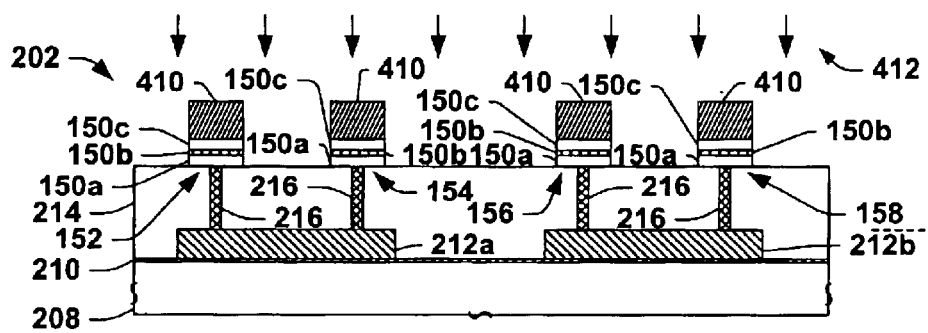
FIGS. 13A and 13B provide a partial side elevation view in section illustrating patterning of the dielectric and electrode layers using a single mask to provide a decoupling capacitor and a number of analog capacitor segments in the device of FIG. 12.
Figure 13B:
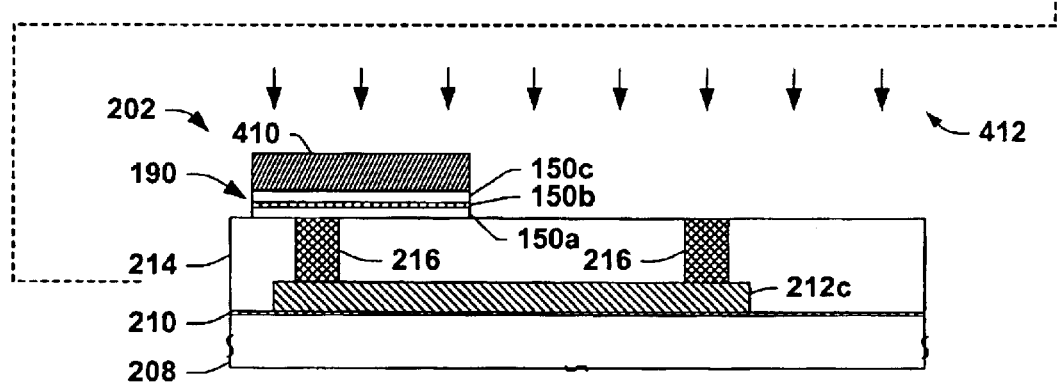
Figure 14:
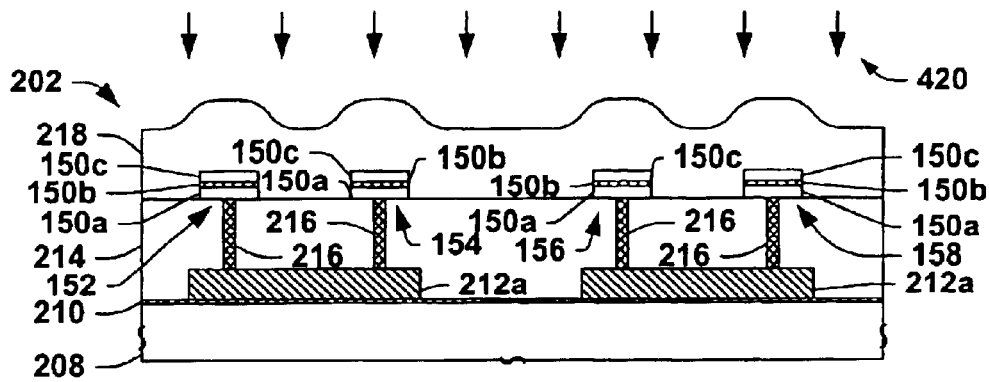
FIG. 14 is a partial side elevation view in section illustrating deposition of an inter layer dielectric (e.g., ILD1) layer in the device of FIG. 13A.

An initial layer 214 of inter layer dielectric material (e.g., ILD0) is formed over the gate dielectric 210 and the polysilicon 212, and tungsten contacts 216 are formed through the ILD0 layer 214 to contact the polysilicon structures 212. The analog capacitor segments 152, 154, 156, and 158, as well as the decoupling capacitor 190 are fabricated by deposition and patterning of a bottom electrode material 150a, a high k dielectric or ferroelectric material 150b (e.g., TaO in this example), and an upper metal electrode material 150c, which are then patterned using a single mask, as illustrated and described with respect to FIGS. 13A and 13B below. In the illustrated example of FIGS. 5D and 5E, the upper and lower electrodes 150c and 150a comprise TiN or TiAlN, although other materials may be employed, such as Ir, IrO, or other metal materials, in accordance with the invention. A first interconnect level dielectric layer 218 (e.g., ILD1) is formed over the ILD0 layer 214. Trench or via openings are then formed in the ILD1 layer 218 and filled with a first metal material (e.g., M1) to form first layer wiring (e.g., interconnect routing) structures 220, providing interconnection of the segments 152–158 and the decoupling capacitor 190 to subsequent interconnect layers.

A second inter layer dielectric material layer 224 (e.g., ILD2) is then formed over the wiring structures 220 and the ILD1 layer 218. Via and trench openings are formed in the ILD2 layer 224 and filled with a second metal material (e.g., M2) to form second layer vias 226 and wiring structures 228 for connecting the decoupling capacitor 190, as well as the end terminals 160 and 162 for the segmented analog capacitor 150. In addition, the second metal material provides a connection structure 230 for connecting the upper electrodes 150c of the intermediate analog capacitor segments 154 and 156.

Figure 6:
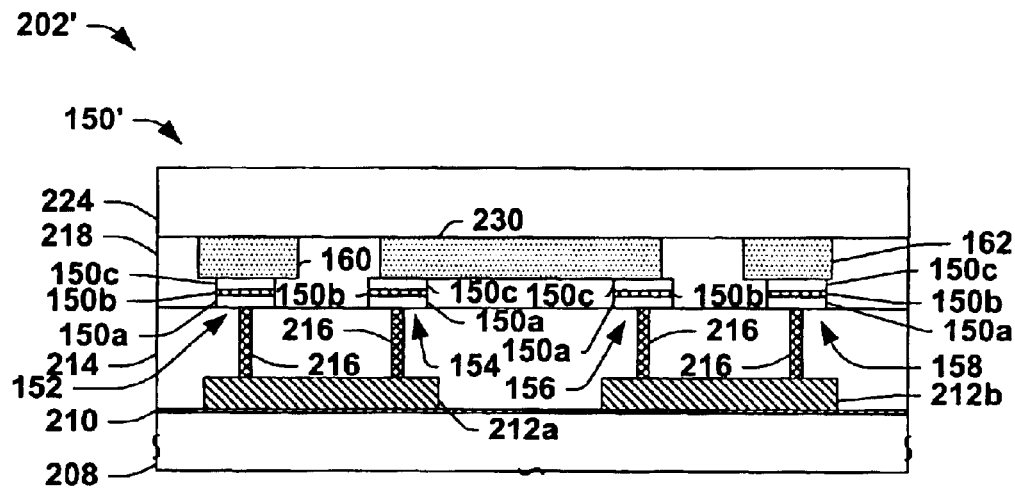
FIG. 6 is a partial side elevation view in section illustrating another exemplary four segment analog capacitor in accordance with the invention.
Figure 7:
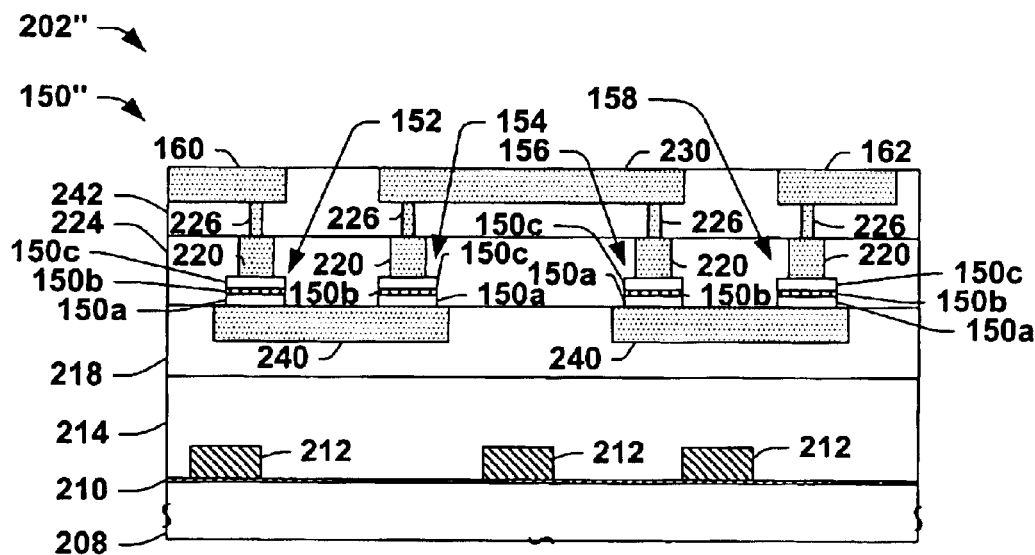
FIG. 7 is a partial side elevation view in section illustrating yet another exemplary four segment analog capacitor in accordance with the invention.

Alternate structures are of course possible within the scope of the present invention, two of which are shown in FIGS. 6 and 7 for purposes of illustration. However, it will be appreciated that the invention is not limited to the specific methods and structures illustrated and described herein. In FIG. 6, another possible implementation is illustrated wherein a semiconductor device 202' comprises a segmented analog capacitor 150' formed of segments 152–158 in the ILD1 layer 214, wherein the terminals 160 and 162, as well as the connection structure 230 are formed by deposition of the first metal layer M1 material in openings in the ILD1 layer 214. In FIG. 7, another semiconductor device 202" comprises a segmented analog capacitor 150" formed of segments 152–158 in the second ILD2 layer 224. In this implementation, the capacitor 150" is further spaced vertically from the substrate 208 to mitigate parasitic effects, wherein the polysilicon structures 212 are not used for coupling of the segments 152–158. Rather, metal structures 240 are provided in the M1 openings in the ILD1 layer 218 to couple the bottom electrodes 150a of the segments 152 and 154, as well as to couple the bottom electrodes of the segments 156 and 158. In this implementation, the wiring structures 220 are formed in the ILD2 layer 224 and the vias 226, the terminals 160, 162, and the connection structure 230 are formed in a third inter layer dielectric material 242.

Figure 8A:
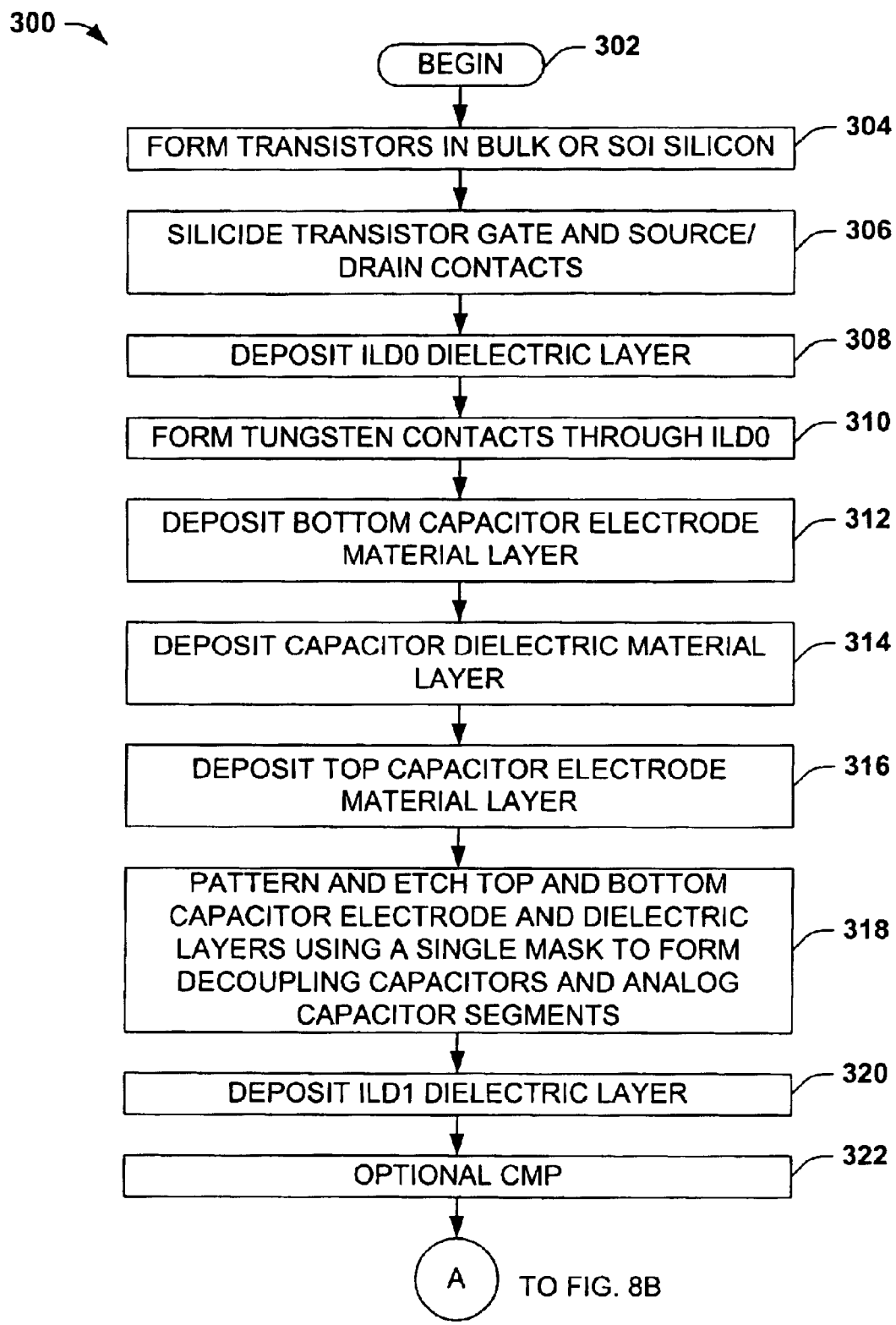
FIGS. 8A and 8B provide a flow diagram illustrating an exemplary method in accordance with another aspect of the invention.
Figure 8B:
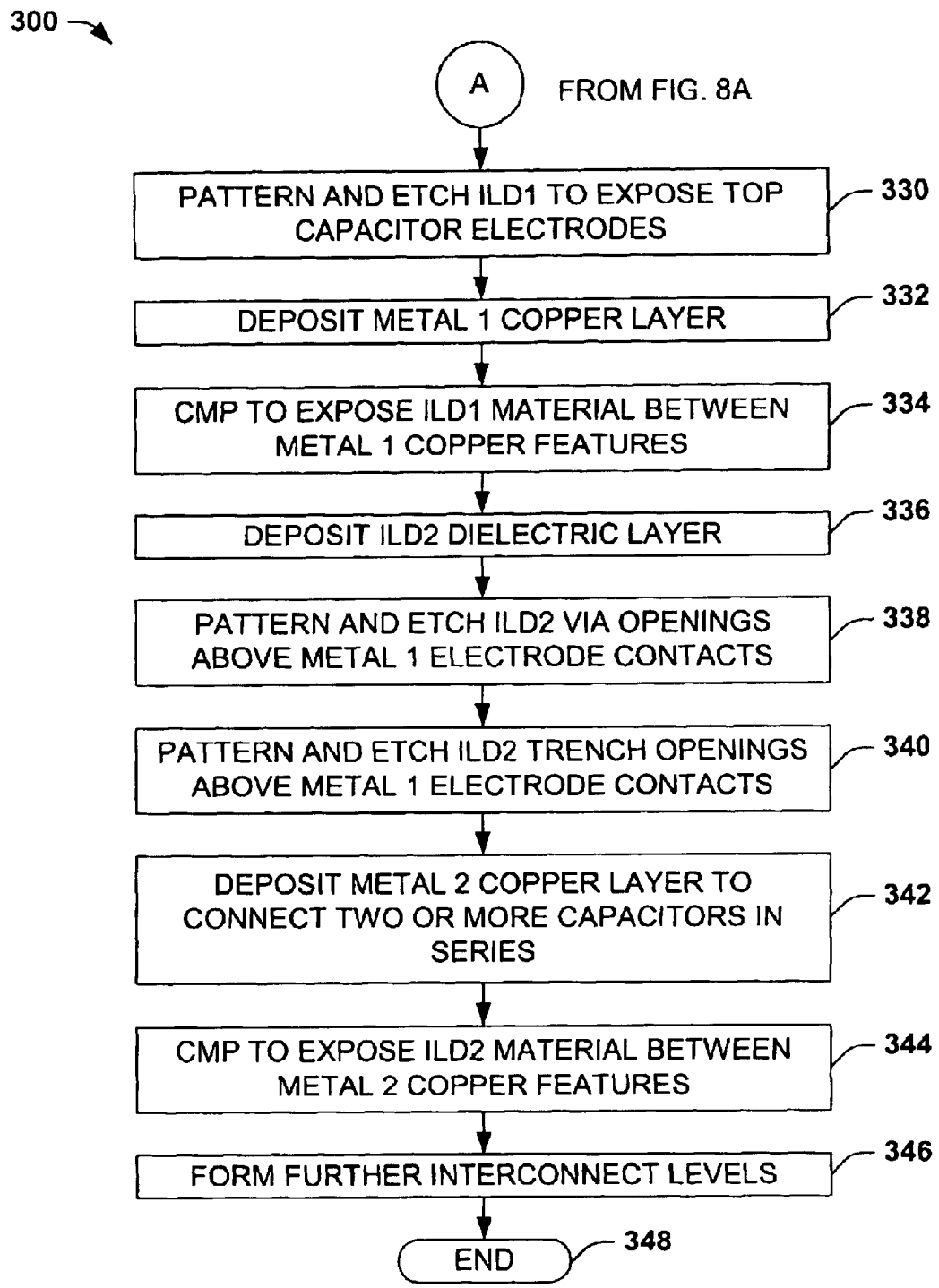

Referring now to FIGS. 8A and 8B, an exemplary method 300 of fabricating capacitors in a mixed-signal semiconductor device is illustrated in accordance with further aspects of the invention. Operation of the method 300 is illustrated in association with an exemplary structure of the semiconductor device 202 in FIGS. 9–23. While the exemplary method 300 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the devices illustrated and described herein as well as in association with other devices and structures not illustrated.

Figure 9:
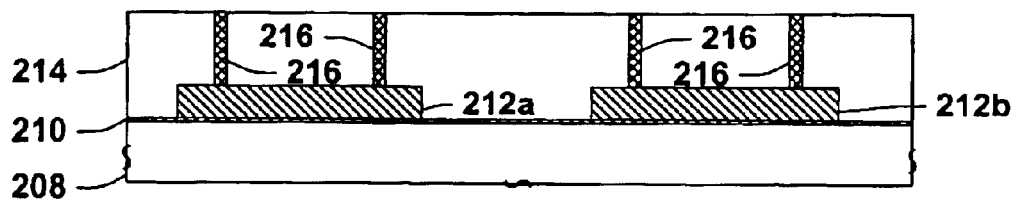
FIG. 9 is a partial side elevation view in section illustrating a semiconductor device at an intermediate stage of fabrication, in which tungsten contacts have been formed in an initial interconnect layer (e.g., ILD0) providing electrical coupling to underlying conductive polysilicon structures formed above a substrate.
Figure 10:
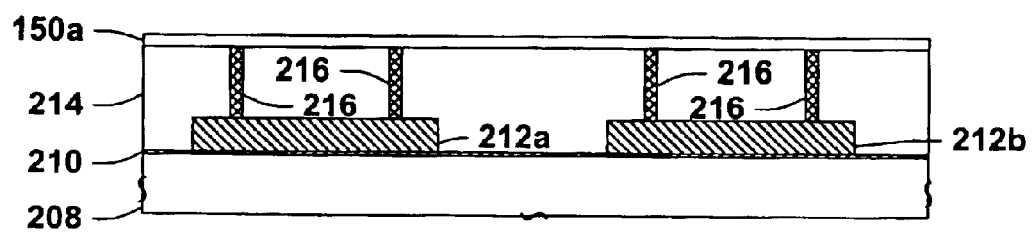
FIG. 10 is a partial side elevation view in section illustrating deposition of a lower or bottom electrode material layer in the device of FIG. 9.
Figure 11:
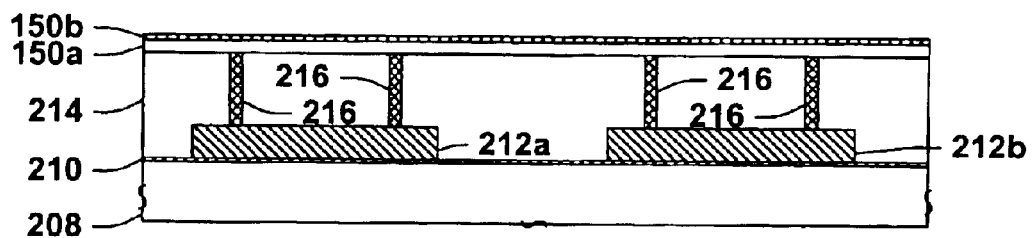
FIG. 11 is a partial side elevation view in section illustrating deposition of a high k dielectric material layer in the device of FIG. 10.
Figure 12:
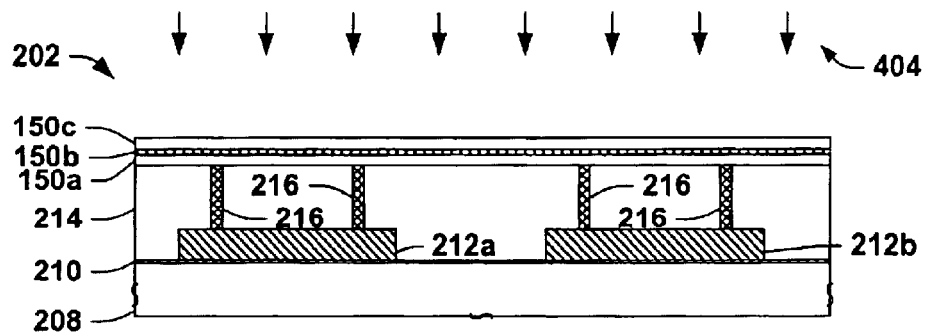
FIG. 12 is a partial side elevation view in section illustrating deposition of an upper or top electrode material layer in the device of FIG. 11.

In accordance with the invention, a single dielectric layer, such as a high k material, may be used in fabricating both decoupling or digital capacitors and segmented analog capacitors. The exemplary method 300 illustrates fabrication of a device such as device 202 of FIGS. 5A–5E above and FIGS. 9–23 below, however other methods are contemplated within the scope of the invention, wherein alternate structures may be fabricated in accordance therewith. Beginning at 302 in FIG. 8A, the exemplary method 300 comprises forming transistors and/or other electrical devices over a bulk substrate or SOI silicon at 304, and siliciding gate and source/drain contacts of the devices at 306. Referring also to FIG. 9, the polysilicon structure 212 for interconnecting analog capacitor segments is also formed at 304, such as during deposition and patterning of polysilicon transistor gate structures (not shown). At 308, an initial ILD0 dielectric layer is deposited (e.g., layer 214 in FIG. 9), and tungsten or other type conductive contacts are formed therethrough at 310 (e.g., contacts 216 providing connection to the polysilicon structure 212 in FIG. 9).

At 312, a lower or bottom capacitor electrode layer (e.g., layer 150a in FIG. 10) is deposited over the ILD0 material, for example, such as TiN, TiAlN, Ir, IrO, or other conductive material deposited to any appropriate thickness, such as about 275 Å using a PVD or CVD process 400. Thereafter, a capacitor dielectric layer (e.g., layer 150b in FIG. 11) is formed over the bottom electrode layer 150a at 314, for example, by depositing a high k dielectric material such as TaO or other, or a ferroelectric material such as PZT, BST, STO, SBT, BTO, BLT, or other to a thickness of about 160–215 Å for TaO using a deposition process 402. An upper or top electrode layer (e.g., 150c in FIG. 12) is then deposited at 316, for example, using the same or similar material and thickness as the bottom layer 150a of 312 (e.g., TiN, TiAlN, Ir, IrO, or other conductive material) via a deposition process 404.

Figure 15:
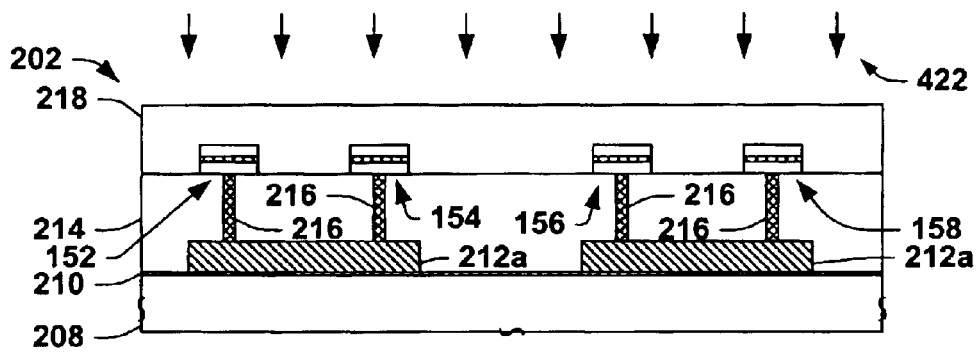
FIG. 15 is a partial side elevation view in section illustrating optional planarization of the ILD1 material in the device of FIG. 14.

At 318, the dielectric and electrode layers are patterned using a single mask 410 and an etch process 412 (FIGS. 13A and 13B) to form unitary decoupling capacitors (e.g., digital capacitor 190) and analog capacitor segments (e.g., segments 152–158), according to any desired pattern. A first inter layer dielectric material ILD1 218 is then formed at 320 via a deposition process 420 (FIG. 14) over the decoupling capacitor 190, the analog capacitor segments 152–158, and the ILD0 layer 214, and then the device 202 is optionally planarized at 322 using a chemical mechanical polishing (CMP) process 422 (FIG. 15).

Figure 16:
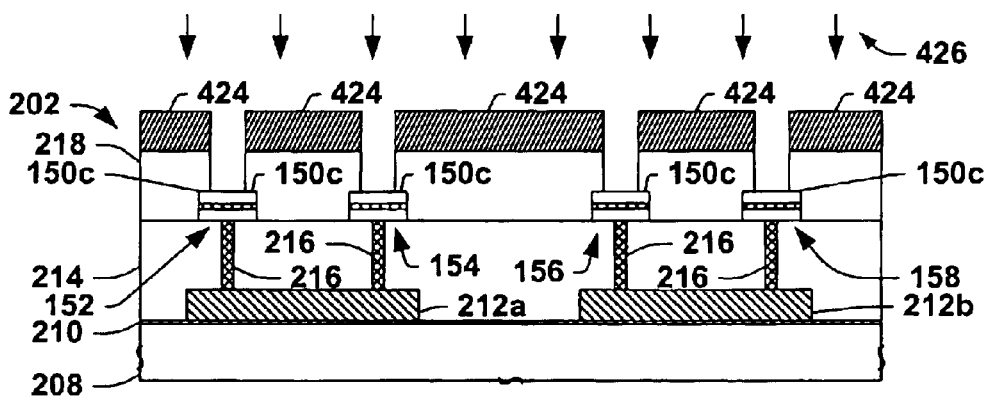
FIG. 16 is a partial side elevation view in section illustrating patterning of the ILD1 material in the device of FIG. 15.
Figure 17:
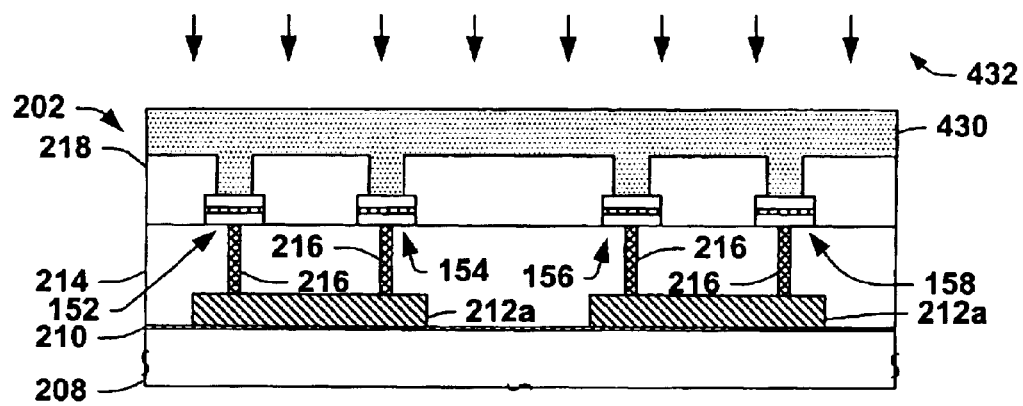
FIG. 17 is a partial side elevation view in section illustrating deposition of a first metal material (e.g., M1) to fill the openings patterned in the ILD1 layer in the device of FIG. 16.
Figure 18:
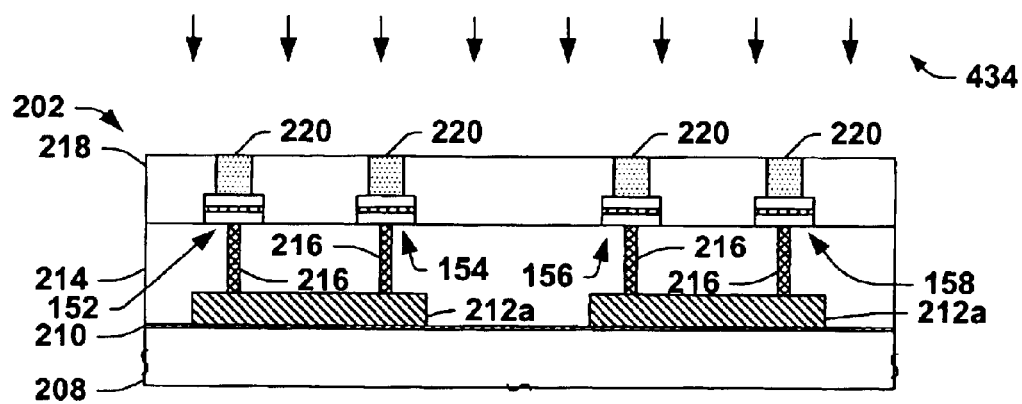
FIG. 18 is a partial side elevation view in section illustrating planarization of the M1 material in the device of FIG. 17.
Figure 19:
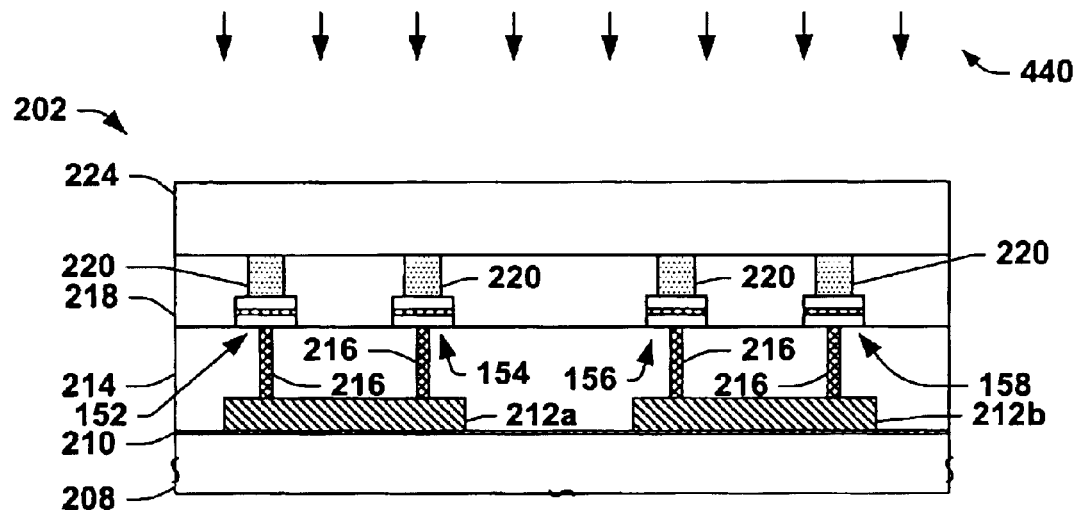
FIG. 19 is a partial side elevation view in section illustrating deposition of a second inter layer dielectric (e.g. ILD2) material in the device of FIG. 18.
Figure 20:
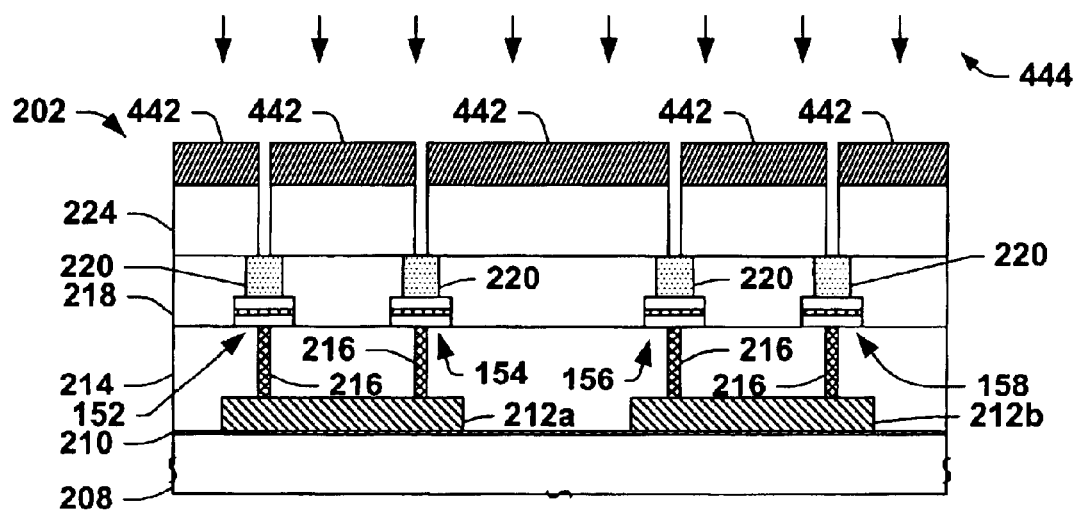
FIG. 20 is a partial side elevation view in section illustrating patterning of via openings in the ILD2 material in the device of FIG. 19.
Figure 21:
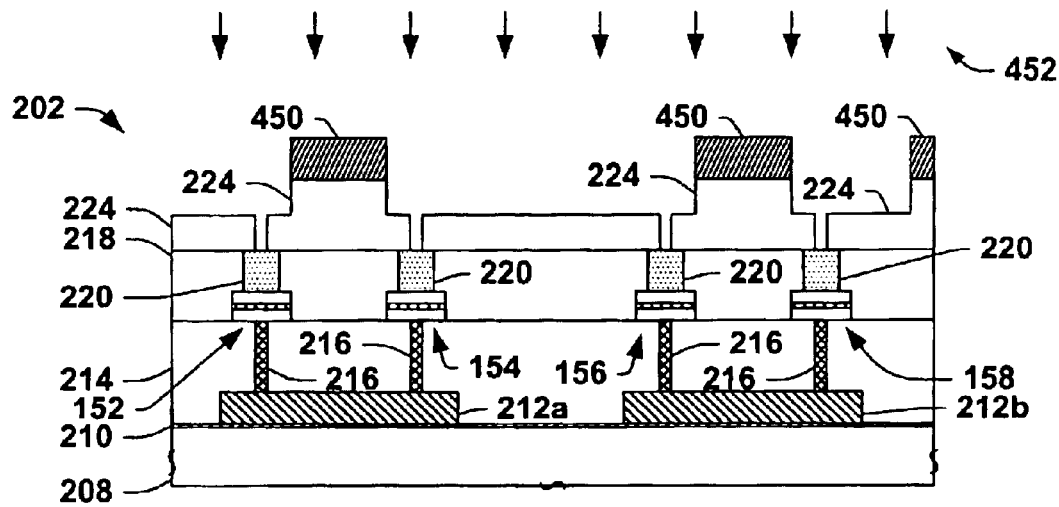
FIG. 21 is a partial side elevation view in section illustrating patterning of trench openings in the ILD2 material in the device of FIG. 20.
Figure 22:
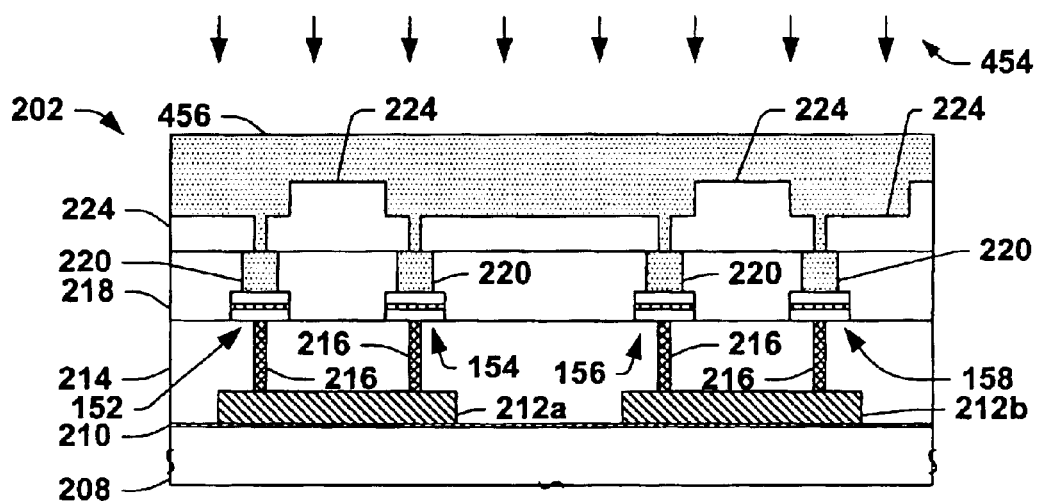
FIG. 22 is a partial side elevation view in section illustrating deposition of a second metal material (e.g., M2) to fill the via and trench openings patterned in the ILD2 layer in the device of FIG. 21.
Figure 23:
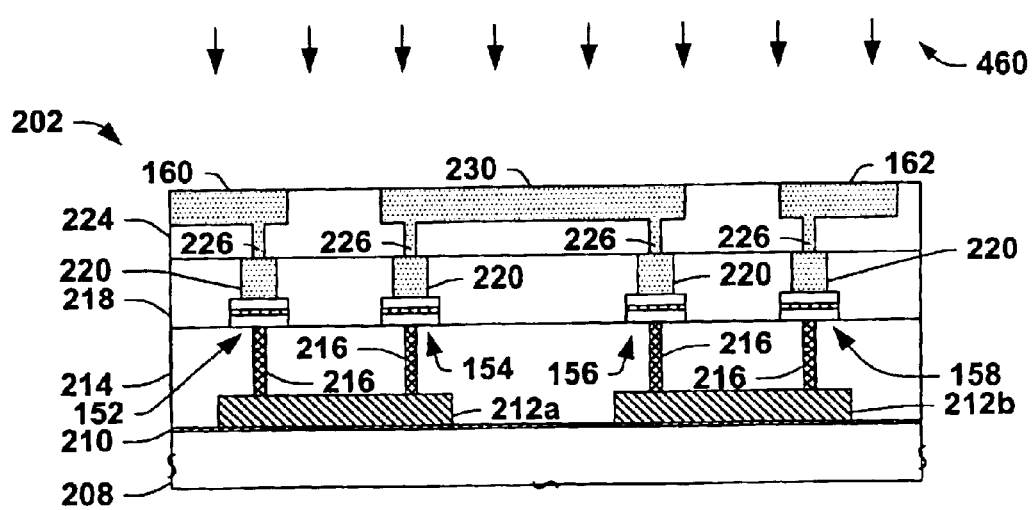
FIG. 23 is a partial side elevation view in section illustrating a four segment analog capacitor fabricated in accordance with the present invention.

Referring also to FIG. 8B and FIG. 16, the method 300 continues at 330 where the ILD1 layer 218 is patterned using a mask 424 and etched using an etch process 426 to expose all or portions of the top electrodes 150c. It is noted at this point that other trenches (not shown) are formed by the process 426, which do not land on the capacitor segments, but instead extend downward to other contacts (not shown) or to the bottom of the ILD1 layer 218. For example, interconnect metal lines may be routed in the ILD1 layer 218 between adjacent analog capacitor segments. In such a case, it may be more desirable to skip the optional planarization process 422 so that all the trenches etched via the process 426 are of generally similar depths, thereby reducing disparities in the amount of overetch in the trenches. Following the trench etch of FIG. 16, a first metal layer 430 (FIG. 17) is deposited at 332 (e.g., M1), such as copper or other conductive metal material via a deposition process 432, and the wafer is then planarized at 334 via a CMP process 434 (FIG. 18) to expose the ILD1 material 218 between the M1 copper features 220. At 336, a second inter layer dielectric material ILD2 224 is deposited via a deposition process 440 (FIG. 19), which is then patterned using a mask 442 and etched via an etch process 444 (FIG. 20) at 338 to form via openings therethrough. A trench mask 450 (FIG. 21) is then employed at 340 to perform a patterned etch process 452, by which trench openings are formed in the ILD2 layer 224. At 342, a second copper metal layer 456 (e.g., M2) is deposited via a deposition process 454 (FIG. 22) to fill the via and trench openings in the ILD2 layer 224, and at 344 a CMP process 460 (FIG. 23) is employed to planarize the wafer. Thereafter at 346, further interconnect layers or levels (not shown) are formed to provide the desired electrical device interconnection before the method 300 ends at 348.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of fabricating capacitors in a mixed-signal semiconductor device, comprising:
    forming a dielectric layer above a wafer;
    forming a decoupling capacitor and a plurality of analog capacitor segments using the dielectric layer; and
    coupling two or more of the analog capacitor segments in series to form an analog capacitor.

2. The method of claim 1, comprising:
    forming a bottom electrode layer above the wafer before forming the dielectric layer, the bottom electrode layer comprising a first conductive material; and
    forming a top electrode layer over the dielectric layer, the top electrode layer comprising a second conductive material;
    wherein forming the decoupling capacitor and the plurality of analog capacitor segments comprises patterning the top and bottom electrode layers and the dielectric layer using a single mask.

3. The method of claim 2, wherein patterning the top and bottom electrode layers and the dielectric layer using a single mask comprises:
    forming a resist layer over the top electrode layer;
    selectively removing portions of the resist layer to expose portions of the top electrode layer and to leave other portions of the top electrode layer covered over a prospective decoupling capacitor and a plurality of prospective analog capacitor segments;
    etching the exposed portions of the top electrode layer to expose underlying portions of the dielectric layer;
    etching the exposed portions of the dielectric layer to expose underlying portions of the bottom electrode layer; and
    etching the exposed portions of the bottom electrode layer to provide the decoupling capacitor and the plurality of analog capacitor segments separated from one another, wherein the decoupling capacitor and the plurality of analog capacitor segments individually comprise unetched portions of the bottom electrode layer, the dielectric layer, and the top electrode layer.

4. The method of claim 1, wherein the portions of the dielectric layer in the decoupling capacitor and the plurality of analog capacitor segments are of substantially the same thickness.

5. The method of claim 4, wherein forming the dielectric layer comprises depositing a dielectric material with a dielectric constant greater than about 8 above the wafer.

6. The method of claim 4, wherein the dielectric layer comprises one of TaO, PZT, BST, STO, SBT, BTO, and BLT, and the top and bottom electrode layers comprise one of TiN, TiAlN, Ir, and IrO.

7. The method of claim 4, wherein the thickness of the portions of the dielectric layer in the decoupling capacitor and the plurality of analog capacitor segments is between 100 Å and 250 Å.

8. The method of claim 7, wherein the thickness of the portions of the dielectric layer in the decoupling capacitor and the plurality of analog capacitor segments is between 160 Å and 215 Å.

9. The method of claim 4, wherein the portions of the top and bottom electrode layers in the decoupling capacitor and the plurality of analog capacitor segments are of a thickness of about 275 Å.

10. The method of claim 4, wherein forming the dielectric layer comprises depositing a high k dielectric material or a ferroelectric material above the wafer.

11. The method of claim 10, wherein coupling two or more of the analog capacitor segments comprises electrically connecting bottom electrode portions of first and second analog capacitor segments to one another or electrically connecting top electrode portions of first and second analog capacitor segments to one another.

12. The method of claim 4, wherein coupling two or more of the analog capacitor segments comprises electrically connecting bottom electrode portions of first and second analog capacitor segments to one another or electrically connecting top electrode portions of first and second analog capacitor segments to one another.

13. The method of claim 3, wherein coupling two or more of the analog capacitor segments comprises electrically connecting bottom electrode portions of first and second analog capacitor segments to one another or electrically connecting top electrode portions of first and second analog capacitor segments to one another.

14. The method of claim 2, wherein coupling two or more of the analog capacitor, segments comprises electrically connecting bottom electrode portions of first and second analog capacitor segments to one another or electrically connecting top electrode portions of first and second analog capacitor segments to one another.

15. The method of claim 14, wherein forming the dielectric layer comprises depositing a high k dielectric material or ferroelectric material above the wafer.

16. The method of claim 15, wherein the dielectric layer comprises one of TaO, PZT, BST, STO, SBT, BTO, and BLT, and the top and bottom electrode layers comprise one of TiN, TiAlN, Ir, and IrO.

17. The method of claim 14, wherein coupling two or more of the analog capacitor segments comprises electrically connecting bottom electrode portions of first and second analog capacitor segments to one another, electrically connecting top electrode portions of second and third analog capacitor segments to one another, and electrically connecting bottom electrode portions of third and fourth analog capacitor segments to one another to form an analog capacitor.

18. The method of claim 1, wherein coupling two or more of the analog capacitor segments comprises electrically connecting bottom electrode portions of first and second analog capacitor segments to one another or electrically connecting top electrode portions of first and second analog capacitor segments to one another.

19. The method of claim 18, wherein forming the dielectric layer comprises depositing a high k dielectric material or ferroelectric material above the wafer.

20. The method of claim 19, wherein the dielectric layer comprises one of TaO, PZT, BST, STO, SBT. BTO, and BLT, and the top and bottom electrode layers comprise one of TiN. TiAlN. Ir, and IrO.

21. The method of claim 18, wherein coupling two or more of the analog capacitor segments comprises electrically connecting bottom electrode portions of first and second analog capacitor segments to one another,electrically connecting top electrode portions of second and third analog third analog capacitor segments to one another, and electrically connecting bottom electrode portions of third and fourth analog capacitor segments to one another to form an analog capacitor.

22. The method of claim 1, wherein coupling two or more of the analog capacitor segments comprises electrically connecting bottom electrode portions of first and second analog capacitor segments to one another, electrically connecting top electrode portions or second and third analog capacitor segments to one another, and electrically connecting bottom electrode portions of third and fourth analog capacitor segments to one another to form an analog capacitor.

23. The method of claim 1, wherein forming the dielectric layer comprises depositing a high k dielectric material or ferroelectric material above the wafer.

24. The method of claim 23, wherein the dielectric layer comprises one of TaO, PZT, BST, STO, SBT, BTO, and BLT material, and the top and bottom electrode layers comprise one of one of TiN, TiAlN, Ir, and IrO.

25. A method of fabricating analog and decoupling capacitors in semiconductor device, comprising:

forming a dielectric layer;

forming a decoupling capacitor and a plurality of analog capacitor segments using the dielectric layer; and forming an analog capacitor by serially coupling two or more of the analog capacitor segments in opposite polarity.

26. The method of claim 25, wherein forming the dielectric layer comprises depositing a high k dielectric material or ferroelectric material above the wafer.

27. The method of claim 25, wherein forming the decoupling capacitor and the plurality of analog capacitor segments comprises:

forming a bottom electrode layer above a wafer before forming the dielectric layer, the bottom electrode layer comprising a first conductive material;

forming a top electrode layer over the dielectric layer, the top electrode layer comprising a second conductive material; and patterning the top and bottom electrode layers and the dielectric layer using a single mask.

28. The method of claim 27, wherein patterning the top and bottom electrode layers and the dielectric layer using a single mask comprises:

forming a resist layer over the top electrode layer;

selectively removing portions of the resist layer to expose portions of the top electrode layer and to leave other portions of the top electrode layer covered over a prospective decoupling capacitor and a plurality of prospective analog capacitor segments;

etching the exposed portions of the top electrode layer to expose underlying portions of the dielectric layer;

etching the exposed portions of the dielectric layer to expose underlying portions of the bottom electrode layer; and etching the exposed portions of the bottom electrode layer to provide the decoupling capacitor and the plurality of analog capacitor segments separated from one another, wherein the decoupling capacitor and the plurality of analog capacitor segments individually comprise unetched portions of the bottom electrode layer, the dielectric layer, and the top electrode layer.

29. The method of claim 26, wherein the dielectric layer comprises one of TaO, PZT, BST, STO, SBT, BTO, and BLT, and the top and bottom electrode layers comprise one of TiN, TiAlN, Ir, and IrO.

30. The method of claim 25, wherein forming an analog capacitor by serially coupling two or more of the analog capacitor segments in opposite polarity comprises electrically connecting bottom electrode portions of first and second analog capacitor segments to one another or electrically connecting top electrode portions of first and second analog capacitor segments to one another.

31. The method of claim 25, wherein forming an analog capacitor by serially coupling two or more of the analog capacitor segments in opposite polarity comprises electrically connecting bottom electrode portions of first and second analog capacitor segments to one another, electrically connecting lop electrode portions of second and third analog capacitor segments to one another, and electrically connecting bottom electrode portions of third and fourth analog capacitor segments to one another to form an analog capacitor.

* * * * *